(12) United States Patent
Dhindsa et al.

(10) Patent No.: US 9,184,028 B2
(45) Date of Patent: Nov. 10, 2015

(54) DUAL PLASMA VOLUME PROCESSING APPARATUS FOR NEUTRAL/ION FLUX CONTROL

(75) Inventors: Rajinder Dhindsa, San Jose, CA (US);
Alexei Marakhatnov, Albany, CA (US);
Andrew D. Bailey, III, Pleasanton, CA (US)

(73) Assignee: Lam Research Corporation, Fremont, CA (US)

(*) Notice: Subject to any disclaimer, the term of this patent is extended or adjusted under 35 U.S.C. 154(b) by 637 days.

(21) Appl. No.: 12/850,559

(22) Filed: Aug. 4, 2010

(65) Prior Publication Data
US 2012/0031559 A1    Feb. 9, 2012

(51) Int. Cl.
C23F 1/00 (2006.01)
H01L 21/306 (2006.01)
H01J 37/32 (2006.01)

(52) U.S. Cl.
CPC ..... *H01J 37/32091* (2013.01); *H01J 37/32449* (2013.01); *H01J 37/32834* (2013.01)

(58) Field of Classification Search
CPC .................................................. H01J 37/32091
USPC ...................................... 156/345.34; 118/715
See application file for complete search history.

(56) References Cited

U.S. PATENT DOCUMENTS

| | | | |
|---|---|---|---|
| 4,134,425 A * | 1/1979 | Gussefeld et al. | ......... 137/625.3 |
| 4,209,357 A | 6/1980 | Gorin et al. | |
| 4,579,618 A | 4/1986 | Celestino et al. | |
| 4,590,042 A | 5/1986 | Drage | |
| 4,780,169 A | 10/1988 | Stark et al. | |
| 5,102,523 A | 4/1992 | Beisswenger et al. | |
| 5,246,526 A | 9/1993 | Yamaguchi et al. | |
| 5,248,371 A | 9/1993 | Maher et al. | |
| 5,422,139 A | 6/1995 | Fischer | |

(Continued)

FOREIGN PATENT DOCUMENTS

CN   101540273 A   9/2009
EP   0756309 A1   1/1997
(Continued)

OTHER PUBLICATIONS

International Search Report and Written Opinion for PCT/US2011/041524, mailed on Feb. 21, 2012.
(Continued)

*Primary Examiner* — Keath Chen
(74) *Attorney, Agent, or Firm* — Martine Penilla Group, LLP

(57) ABSTRACT

A semiconductor wafer processing apparatus includes a first electrode exposed to a first plasma generation volume, a second electrode exposed to a second plasma generation volume, and a gas distribution unit disposed between the first and second plasma generation volumes. The first electrode is defined to transmit radiofrequency (RF) power to the first plasma generation volume, and distribute a first plasma process gas to the first plasma generation volume. The second electrode is defined to transmit RF power to the second plasma generation volume, and hold a substrate in exposure to the second plasma generation volume. The gas distribution unit includes an arrangement of through-holes defined to fluidly connect the first plasma generation volume to the second plasma generation volume. The gas distribution unit also includes an arrangement of gas supply ports defined to distribute a second plasma process gas to the second plasma generation volume.

32 Claims, 9 Drawing Sheets

(56) References Cited

U.S. PATENT DOCUMENTS

| | | | |
|---|---|---|---|
| 5,487,785 | A | 1/1996 | Horiike et al. |
| 5,496,410 | A | 3/1996 | Fukuda et al. |
| 5,614,026 | A | 3/1997 | Williams |
| 5,888,907 | A | 3/1999 | Tomoyasu et al. |
| 5,891,350 | A | 4/1999 | Shan et al. |
| 5,976,261 | A | 11/1999 | Moslehi et al. |
| 6,020,458 | A * | 2/2000 | Lee et al. ............... 528/401 |
| 6,074,488 | A * | 6/2000 | Roderick et al. ............ 118/728 |
| 6,126,753 | A | 10/2000 | Shinriki et al. |
| 6,162,323 | A | 12/2000 | Koshimizu |
| 6,261,408 | B1 * | 7/2001 | Schneider et al. ....... 156/345.26 |
| 6,432,831 | B2 | 8/2002 | Dhindsa et al. |
| 6,537,418 | B1 | 3/2003 | Muller et al. |
| 6,565,661 | B1 | 5/2003 | Nguyen |
| 6,800,139 | B1 | 10/2004 | Shinriki et al. |
| 6,821,563 | B2 | 11/2004 | Yudovsky |
| 6,821,910 | B2 | 11/2004 | Adomaitis et al. |
| 6,963,043 | B2 | 11/2005 | Fink |
| 7,011,711 | B2 | 3/2006 | Shreter et al. |
| 7,273,526 | B2 | 9/2007 | Shinriki et al. |
| 7,410,676 | B2 | 8/2008 | Kim et al. |
| 7,452,827 | B2 | 11/2008 | Gianoulakis et al. |
| 7,462,243 | B2 * | 12/2008 | Laflamme et al. ............ 118/715 |
| 7,552,521 | B2 | 6/2009 | Fink |
| 7,601,223 | B2 | 10/2009 | Lindfors et al. |
| 7,666,479 | B2 | 2/2010 | Strang |
| 7,718,030 | B2 | 5/2010 | Funk et al. |
| 7,789,961 | B2 | 9/2010 | Nelson et al. |
| 7,794,546 | B2 | 9/2010 | Li |
| 7,845,309 | B2 | 12/2010 | Condrashoff et al. |
| 8,038,834 | B2 | 10/2011 | Funk et al. |
| 8,075,728 | B2 | 12/2011 | Balakrishna et al. |
| 8,152,925 | B2 | 4/2012 | Iizuka |
| 8,187,679 | B2 | 5/2012 | Dickey et al. |
| 8,211,231 | B2 | 7/2012 | Kerr et al. |
| 8,216,419 | B2 | 7/2012 | Moshtagh et al. |
| 8,236,106 | B2 | 8/2012 | Iizuka et al. |
| 8,277,888 | B2 | 10/2012 | Dedontney |
| 8,313,610 | B2 | 11/2012 | Dhindsa |
| 8,540,844 | B2 | 9/2013 | Hudson et al. |
| 8,545,940 | B2 | 10/2013 | Choi et al. |
| 2002/0005442 | A1 | 1/2002 | Watanabe et al. |
| 2002/0160125 | A1 | 10/2002 | Johnson et al. |
| 2004/0035532 | A1 | 2/2004 | Jung |
| 2004/0067641 | A1 | 4/2004 | Yudovsky |
| 2004/0082251 | A1 | 4/2004 | Bach et al. |
| 2004/0134611 | A1 | 7/2004 | Kato et al. |
| 2004/0149394 | A1 * | 8/2004 | Doan et al. .................... 156/916 |
| 2005/0005859 | A1 | 1/2005 | Koshiishi et al. |
| 2005/0103265 | A1 | 5/2005 | Gianoulakis et al. |
| 2005/0208217 | A1 * | 9/2005 | Shinriki et al. ............ 427/248.1 |
| 2005/0229848 | A1 | 10/2005 | Shinriki et al. |
| 2005/0255257 | A1 | 11/2005 | Choi et al. |
| 2006/0021701 | A1 | 2/2006 | Tobe et al. |
| 2006/0090850 | A1 | 5/2006 | Laflamme et al. |
| 2006/0234514 | A1 | 10/2006 | Gianoulakis et al. |
| 2007/0026540 | A1 | 2/2007 | Nooten et al. |
| 2007/0042131 | A1 * | 2/2007 | Soo et al. ....................... 427/569 |
| 2007/0062645 | A1 * | 3/2007 | Fukuchi ................... 156/345.24 |
| 2007/0068625 | A1 | 3/2007 | Funk et al. |
| 2007/0193515 | A1 * | 8/2007 | Jeon et al. ................ 118/723 IR |
| 2007/0209590 | A1 | 9/2007 | Li |
| 2008/0011424 | A1 * | 1/2008 | Yin et al. .................. 156/345.48 |
| 2008/0020574 | A1 | 1/2008 | Marakhtanov et al. |
| 2008/0035605 | A1 | 2/2008 | Takahashi |
| 2008/0099426 | A1 * | 5/2008 | Kumar et al. ..................... 216/12 |
| 2008/0160776 | A1 | 7/2008 | Dhindsa et al. |
| 2008/0230518 | A1 * | 9/2008 | Brillhart et al. .................. 216/58 |
| 2009/0095334 | A1 | 4/2009 | Huston |
| 2009/0136665 | A1 | 5/2009 | Choi et al. |
| 2009/0218317 | A1 * | 9/2009 | Belen et al. ....................... 216/67 |
| 2009/0229754 | A1 | 9/2009 | Iizuka et al. |
| 2009/0236041 | A1 | 9/2009 | Iizuka |
| 2011/0248634 | A1 | 10/2011 | Heil et al. |
| 2012/0024449 | A1 | 2/2012 | Ricci et al. |
| 2012/0031559 | A1 | 2/2012 | Dhindsa et al. |
| 2012/0034786 | A1 | 2/2012 | Dhindsa et al. |

FOREIGN PATENT DOCUMENTS

| | | |
|---|---|---|
| JP | H09-291366 A | 11/1997 |
| JP | 2006-041539 A | 2/2006 |
| JP | 2007-067005 A | 3/2007 |
| JP | 2010-512031 A | 4/2010 |
| KR | 10-2009-0017177 A | 2/2009 |
| KR | 10-2009-0100310 A | 9/2009 |
| KR | 10-2009-0112909 A | 10/2009 |
| WO | WO 2008/070181 A | 6/2008 |

OTHER PUBLICATIONS

International Search Report and Written Opinion from PCT/US2011/041522, mailed Feb. 20, 2012.

* cited by examiner (Bottom View)

(Top View)

○ : Angled Through-Hole 117
□ : Straight Through-Hole 117

(Top View)

○ : Angled Through-Hole 117

(Top View)

○ : Angled Through-Hole 117
▫ : Straight Through-Hole 117

(Top View)

DUAL PLASMA VOLUME PROCESSING APPARATUS FOR NEUTRAL/ION FLUX CONTROL

CROSS-REFERENCE TO RELATED APPLICATIONS

This application is related to U.S. patent application Ser. No. 12/850,552, filed on even date herewith, entitled "Plasma Processing Chamber with Dual Axial Gas Injection and Exhaust." The disclosure of the above-identified related application is incorporated herein by reference in its entirety.

BACKGROUND OF THE INVENTION

Current plasma processing systems used in semiconductor wafer fabrication rely on highly interdependent control parameters to control radical separation, radical flux, ion energy, and ion flux delivered to the wafer. For example, current plasma processing systems attempt to achieve necessary radical separation, radical flux, ion energy, and ion flux by controlling a single plasma generated in the presence of the wafer. Unfortunately, chemistry dissociation and radical formation are coupled to ion production and plasma density and often do not work in concert to achieve the desired plasma processing conditions.

For example, it is difficult in current plasma processing systems to obtain higher chemical dissociation and lower ion density simultaneously in the same plasma, as the higher chemical dissociation requires application of higher power which in turn causes generation of higher ion density. Also, in current plasma processing systems, the high interdependence of the control parameters limits smaller technology node application processing windows and/or manufacturing capability. Given the foregoing, there is a need for a plasma processing system that provides for independent control of radical/neutral flux relative to ion flux.

SUMMARY OF THE INVENTION

In one embodiment, a semiconductor wafer processing apparatus is disclosed. The apparatus includes a first electrode exposed to a first plasma generation volume. The first electrode is defined to transmit radiofrequency (RF) power to the first plasma generation volume. The first electrode is further defined to distribute a first plasma process gas to the first plasma generation volume. The apparatus also includes a second electrode exposed to a second plasma generation volume. The second electrode is defined to transmit RF power to the second plasma generation volume. The second electrode is further defined to hold a substrate in exposure to the second plasma generation volume. The apparatus further includes a gas distribution unit disposed between the first plasma generation volume and the second plasma generation volume. The gas distribution unit is defined to include an arrangement of through-holes that each extend through the gas distribution unit to fluidly connect the first plasma generation volume to the second plasma generation volume. The gas distribution unit is further defined to include an arrangement of gas supply ports defined to distribute a second plasma process gas to the second plasma generation volume.

In another embodiment, a system for semiconductor wafer processing is disclosed. The system includes a chamber defined to have an interior cavity and an exhaust port that provides for fluid connection of the interior cavity to an exhaust pump. The system also includes a dual plasma processing apparatus disposed within the interior cavity of the chamber. The dual plasma processing apparatus includes an upper plasma chamber that includes an upper plasma generation volume. The dual plasma processing apparatus also includes a showerhead electrode defined above the upper plasma generation volume to supply a first plasma process gas and RF power to the upper plasma generation volume. The dual plasma processing apparatus also includes a lower plasma chamber that includes a lower plasma generation volume. The dual plasma processing apparatus also includes a gas distribution unit disposed between the upper and lower plasma generation volumes. The gas distribution unit is defined to supply a second plasma process gas to the lower plasma generation volume. The gas distribution unit is further defined to provide controlled fluid communication between the upper and lower plasma generation volumes. The system further includes a chuck disposed within the interior cavity of the chamber below the lower plasma generation volume. The chuck is defined to hold a substrate in exposure to the lower plasma generation volume. The chuck is further defined to supply RF power to the lower plasma generation volume. Each of the upper and lower plasma chambers is respectively defined to exhaust the upper and lower plasma generation volumes into the interior cavity of the chamber.

In another embodiment, a gas distribution unit is disclosed. The gas distribution unit includes a plate formed to separate an upper plasma generation volume from a lower plasma generation volume. An upper surface of the plate provides a lower boundary of the upper plasma generation volume. A lower surface of the plate provides an upper boundary of the lower plasma generation volume. The plate includes an arrangement of through-holes that each extend through the plate from the upper surface of the plate to the lower surface of the plate, so as to fluidly connect the upper plasma generation volume to the lower plasma generation volume. The plate also includes interior gas supply channels that are fluidly connected to an arrangement of gas supply ports defined on the lower surface of the plate to distribute a plasma process gas to the lower plasma generation volume.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

A semiconductor wafer processing apparatus is disclosed herein to enable decoupling of radical generation on neutral species from ion generation within plasma, such that the radical/neutral species can be independently controlled relative to the charged ion species during semiconductor wafer processing. The apparatus includes an upper, i.e., downstream, plasma generation volume in which the radical/neutral species are generated without concern with regard to associated ion generation. The apparatus also includes a lower plasma generation volume within which a separate plasma of appropriate ion density is generated in exposure to a substrate, i.e., wafer. The radical/neutral species within the upper plasma generation volume are flowed in a controlled manner through a gas distribution unit to the lower plasma generation volume, thereby providing the radical/neutral species constituents for wafer processing.

The radical/neutral species are allowed to travel from the upper plasma generation volume to the lower plasma generation volume through the gas distribution unit which separates the upper and lower plasma generation volumes. However, ions generated in the upper plasma generation volume are prevented by the gas distribution unit from traveling to the lower plasma generation volume. Thus, the gas distribution unit serves as an ion filter. The radical/neutral species contributed from the upper plasma generation volume are used for wafer processing in the lower plasma generation volume. The ions generated in the lower plasma generation volume represent the charged species used for wafer processing.

The upper and lower plasma generation volumes are independently controllable, such that the radical/neutral flux contributed for wafer processing is generated independently from the ionic plasma generated in exposure to the wafer. Therefore, the upper and lower plasma generation volumes of the apparatus disclosed herein, provide for decoupling of radical/neutral flux from ion flux during wafer processing. Thus, the radical/neutral species can be controlled separate from the ion flux.

Figure 1:
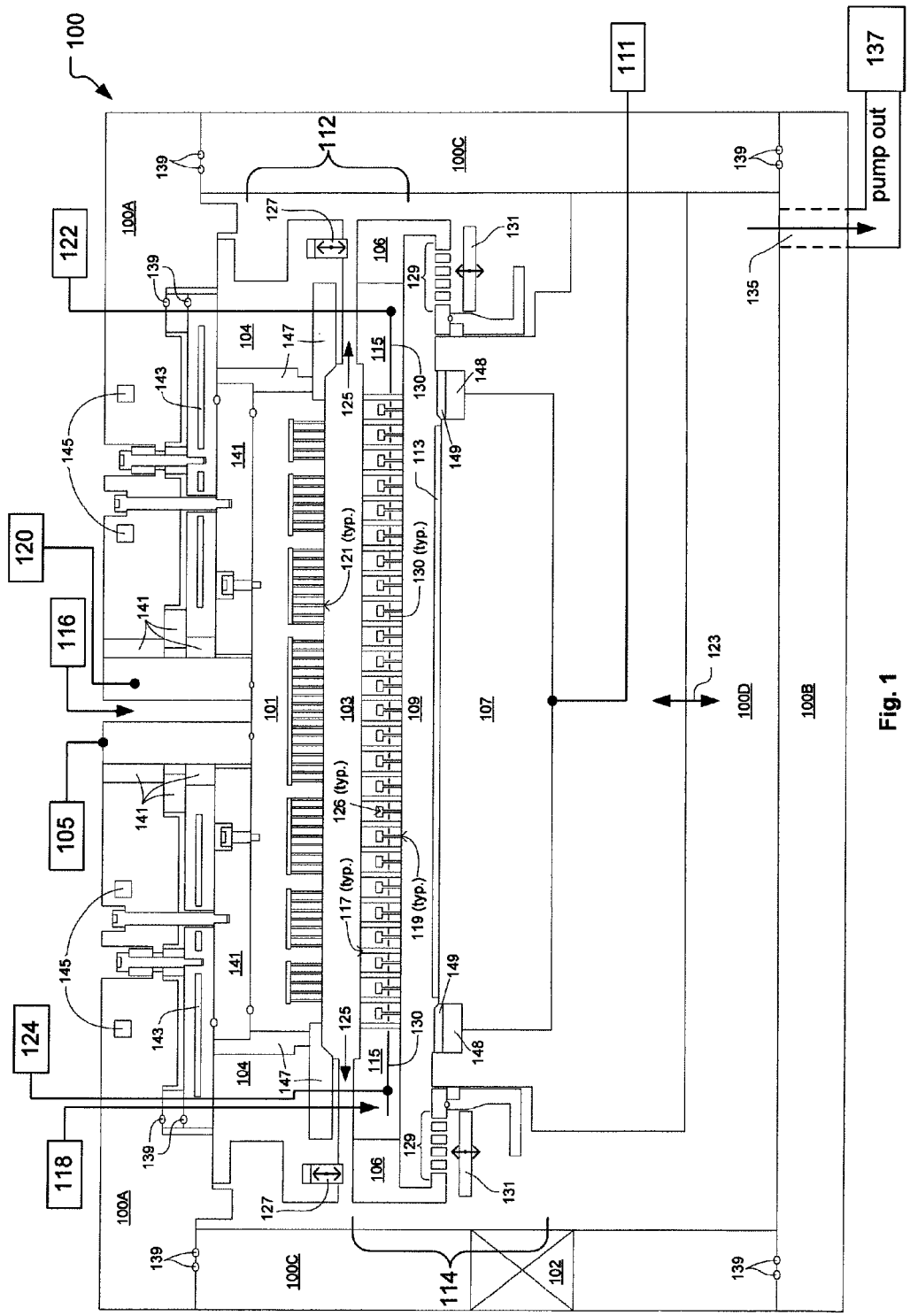
FIG. 1 shows a semiconductor wafer processing apparatus, in accordance with one embodiment of the present invention.

FIG. 1 shows a semiconductor wafer processing apparatus, in accordance with one embodiment of the present invention. The apparatus includes a chamber 100 fanned by a top plate 100A, a bottom plate 100B, and walls 100C. In one embodiment, the walls 100C form a contiguous cylindrical shaped wall 100C. In other embodiments, the walls 100C can have other configurations, so long as an interior cavity 100D of the chamber 100 can be isolated from an external environment outside the chamber 100. A number of seals 139 are disposed between the chamber top plate 100A, bottom plate 100B, and walls 100C to facilitate isolation of the interior cavity 100D of the chamber 100 from the external environment.

In various embodiments, the top plate 100A, bottom plate 100B, and walls 100C of the chamber 100 can be formed of a metal that is a good conductor of electricity and heat, and that is chemically compatible with the process gases to which the interior cavity 100D is to be exposed during wafer processing. For example, in various embodiments, metals such as aluminum, stainless steel, or the like, maybe used to form the chamber 100 components. Also, the seals 139 can be elastomeric seals or consumable metallic seals, or any other type of seal material, so long as the seals 139 are chemically compatible with processing materials to which the interior cavity 100D will be exposed, and so long as the seals 139 provide sufficient isolation of the interior cavity 100D from the external environment outside the chamber 100.

It should be appreciated that in other embodiments, one or more additional plates or members can be disposed outside any one or more of the top plate 100A, bottom plate 100B, or walls 100C, as necessary to satisfy chamber 100 deployment-specific conditions or other considerations. Additionally, the top plate 100A, bottom plate 100B, and/or walls 100C can be fastened to these additional plates or members as appropriate for the particular implementation. The chamber 100 structure, including the top plate 100A, bottom plate 100B and walls 100C, is formed of an electrically conducting material and is electrically connected to a reference ground potential.

The chamber 100 includes an exhaust port 135 which provides for fluid connection of the interior cavity 100D to an external exhaust pump 137, such that a negative pressure can be applied through the exhaust port 135 to remove gases and/or particulates from within the interior cavity 100D. In one embodiment, the chamber 100 also includes a gate valve 102 formed within a section of the chamber wall 100C to enable insertion of a wafer 113 into the interior cavity 100D, and corresponding removal of the wafer 113 from the interior cavity 100D. In its closed position, the gate valve 102 is defined to maintain isolation of the interior cavity 100D from the external environment. In various embodiments, the exhaust pump 137 can be implemented in different ways, so long as the exhaust pump 137 is capable of applying a suction at the exhaust port 135 to draw a fluid flow from the interior cavity 100D of the chamber 100.

A dual plasma processing apparatus is disposed within the interior cavity 100D of the chamber 100. The dual plasma processing apparatus includes an upper plasma chamber 112 that includes an upper plasma generation volume 103. The dual plasma processing apparatus also includes a lower plasma chamber 114 that includes a lower plasma generation volume 109. The upper and lower plasma chambers 112/114 are physically and fluidly connected by a gas distribution unit 115, which is disposed to separate the upper and lower plasma generation volumes 103/109.

The upper plasma chamber 112 is formed in part by an outer structural member 104 defined around a periphery of the upper plasma chamber 112 and connected to the top plate 100A. The upper plasma chamber 112 also includes a showerhead electrode 101 disposed above the upper plasma generation volume 103 within the outer structural member 104. The showerhead electrode 101 is fastened to the top plate 100A by way of an insulating member 141. The insulating member 141 is defined to provide electrical insulation. However, the insulating member 141 is also defined to provide thermal conduction between the showerhead electrode 101 and other components which interface with the insulating member 141.

During operation, radiofrequency (RF) power is transmitted from an RF power source 105 to the showerhead electrode 101. In one embodiment, the RF power source 105 is defined to provide RF power at multiple frequencies. In one embodiment, frequencies of the RF power source 105 are set within a range extending from 1 kHz to 100 MHz. In another embodiment, frequencies of the RF power source 105 are set within a range extending from 400 kHz to 60 MHz. The plasma density is controlled primarily by the RF power source 105.

Additionally, in one embodiment, the showerhead electrode 101 is connected to a DC bias source 120 to enable control of plasma potential within the upper plasma generation volume 103 independent of the plasma density. The DC bias source 120 is defined to control a bias of the showerhead electrode 101 at various voltage settings extending upward from ground. In one embodiment, the DC bias source 120 of the showerhead electrode 101 can be defined to operate in a pulsed manner to synchronize the plasma in the upper plasma generation volume 103 with the plasma in the lower plasma generation volume 109. More specifically, this pulsed control of the DC bias source 120 can be used to control a time-dependent voltage differential between the plasmas in the upper and lower plasma generation volumes 103 and 109.

A heater 143 is disposed above and in contact with both the insulating member 141 and the outer structural member 104. The heater 143 is also secured to the top plate 100A. Additionally, a number of cooling channels 145 are defined within the top plate 100A. A coolant fluid is flowed through the cooling channels 145 to draw heat away from the top plate 100A. In one embodiment, the coolant fluid is water. However, other embodiments may utilize coolant fluids other than water, so long as the coolant fluid is chemically compatible with the material of the top plate 100A. In one embodiment, thermocouple measured temperature feedback from various portions of the chamber 100 is used to control the temperature of the top plate 100A via the heater 143 and cooling channels 145. By way of the heater 143 and the cooling channels 145, a temperature of the showerhead electrode 101, and hence upper plasma generation volume 103, can be controlled.

The showerhead electrode 101 is electrically isolated from the outer structural member 104 by insulating rings 147. In one embodiment, the insulating rings 147 and/or the insulating member 141 are formed of quartz. In other embodiments, the insulating rings 147 and/or the insulating member 141 can be formed of a material other than quartz so long as the material provides for electrical insulation while also providing for thermal conduction.

Figure 2:
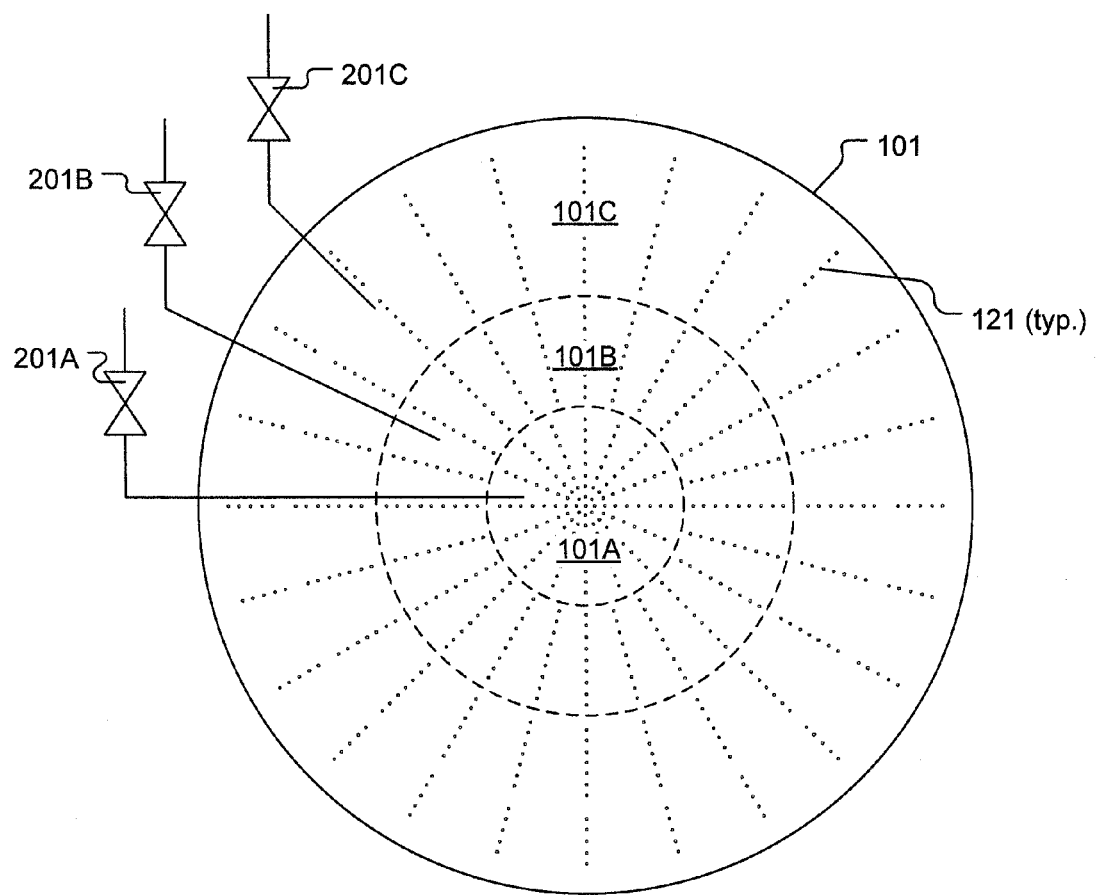
FIG. 2 shows a bottom view of the showerhead electrode, in accordance with one embodiment of the present invention.

FIG. 2 shows a bottom view of the showerhead electrode 101, in accordance with one embodiment of the present invention. The showerhead electrode 101 includes an arrangement of gas supply ports 121 defined to supply plasma process gas to the upper plasma generation volume 103. The plasma process gas is supplied from one or more plasma process gas supply sources 116 to the showerhead electrode 101. It should be understood that in some embodiments the gas supply sources 116 represent multiple gas supplies and/or gas boxes that provide for selection of appropriate gases and/or gas mixtures for flow through the showerhead electrode 101. The showerhead electrode 101 is defined to transmit RF power to the first plasma process gas as its flows through the showerhead electrode 101 to the arrangement of gas supply ports 121 for distribution to the upper plasma generation volume 103.

In various embodiments the showerhead electrode 101 can be formed of metal that is a good conductor of electricity and heat, and that is chemically compatible with the processes to be conducted in the upper plasma generation volume 103, such as aluminum, stainless steel, or the like. In one embodiment, portions of the showerhead electrode 101 that are exposed to plasma in the upper plasma generation volume 103 are protected by a covering of plasma resistant material. In one embodiment, the plasma resistant material is formed as a coating. In another embodiment, the plasma resistant material is formed as a protective structure, e.g., plate, that conformally covers the showerhead electrode 101. In either of these embodiments, the plasma resistant material is secured to the showerhead electrode 101 to ensure adequate electrical and thermal conduction between the plasma resistant material and the showerhead electrode 101. In various embodiments, the plasma resistant coating/covering used to protect the showerhead electrode 101 can be formed of silicon, silicon carbide, silicon oxide, yttrium oxide, or the like.

In one embodiment, such as that depicted in FIG. 2, the gas supply ports 121 of the showerhead electrode 101 are arranged in a number of concentric radial zones 101A, 101B, 101C facing toward the upper plasma generation volume 103. The gas supply ports 121 within each concentric radial zone 101A, 101B, 101C are plumbed to a respective gas flow control device 201A, 201B, 201C, such that supply of the plasma process gas to each concentric radial zone 101A, 101B, 101C is independently controllable. It should be appreciated that the independent control of the plasma process gas supply to the multiple concentric gas supply zones 101A, 101B, 101C of the showerhead electrode 101 provides for increased center-to-edge plasma uniformity control. Although the example embodiment of FIG. 2 shows three concentric gas supply zones 101A, 101B, 101C, it should be understood that the showerhead electrode 101 can be defined to include more or less independently controllable gas supply zones. For example, in another embodiment, the showerhead electrode 101 is defined to include two independently controllable concentric gas supply zones.

As previously discussed, the showerhead electrode 101 forms an upper surface of the upper plasma generation volume 103, with the gas distribution unit 115 forming the lower surface of the upper plasma generation volume 103. In one embodiment, the gas distribution unit 115 provides a ground electrode for the upper plasma generation volume 103. In one embodiment, the showerhead electrode 101 and the gas distribution unit 115 form an approximate one-to-one power-to-ground surface area.

In the embodiment of FIG. 1 with the showerhead electrode 101, the upper plasma chamber 112 is a capacitively coupled plasma chamber. In this embodiment, a vertical distance across the upper plasma generation volume 103, as measured perpendicularly between the lower surface of the showerhead electrode 101 and the upper surface of the gas distribution unit 115, is set within a range extending from about 1 cm to about 5 cm. In one embodiment, this vertical distance across the upper plasma generation volume 103 is about 2 cm. In another embodiment, the showerhead electrode 101 can be functionally replaced by an induction coil, such that the upper plasma chamber 112 is an inductively coupled plasma chamber. In this embodiment, the vertical distance across the upper plasma generation volume 103 can be up to about 12 cm.

The lower plasma chamber 114 is formed in part by an outer structural member 106 defined around a periphery of the lower plasma chamber 114. In one embodiment, the outer structural member 106 of the lower plasma chamber 114 is rigidly connected to the outer structural member 104 of the upper plasma chamber 112 by a number of structural linking members, such that the outer structural member 106 of the lower plasma chamber 114 effectively hangs from the top plate 100A by way of the outer structural member 104 of the upper plasma chamber 112. In this embodiment, the structural linking members can extend through the exhaust channel 125, but are defined to avoid adverse disruption of fluid flow through the exhaust channel 125.

The gas distribution unit 115 is disposed between the upper plasma generation volume 103 and the lower plasma generation volume 109. The gas distribution unit 115 is defined as a plate formed to separate the upper plasma generation volume 103 from the lower plasma generation volume 109, such that an upper surface of the gas distribution unit 115 plate provides a lower boundary of the upper plasma generation volume 103, and such that a lower surface of the gas distribution unit 115 plate provides an upper boundary of the lower plasma generation volume 109.

The gas distribution unit 115 is held in a fixed position by the outer structural member 106 of the lower plasma chamber 114. The gas distribution unit 115 is defined to supply a plasma process gas to the lower plasma generation volume 109 through an arrangement of gas supply ports 119. The gas distribution unit 115 is further defined to include an arrangement of through-holes 117 to provide controlled fluid communication between the upper plasma generation volume 103 and the lower plasma generation volume 109. Each of the through-holes 117 extends through the gas distribution unit 115 plate from its upper surface to its lower surface.

Figure 3A:
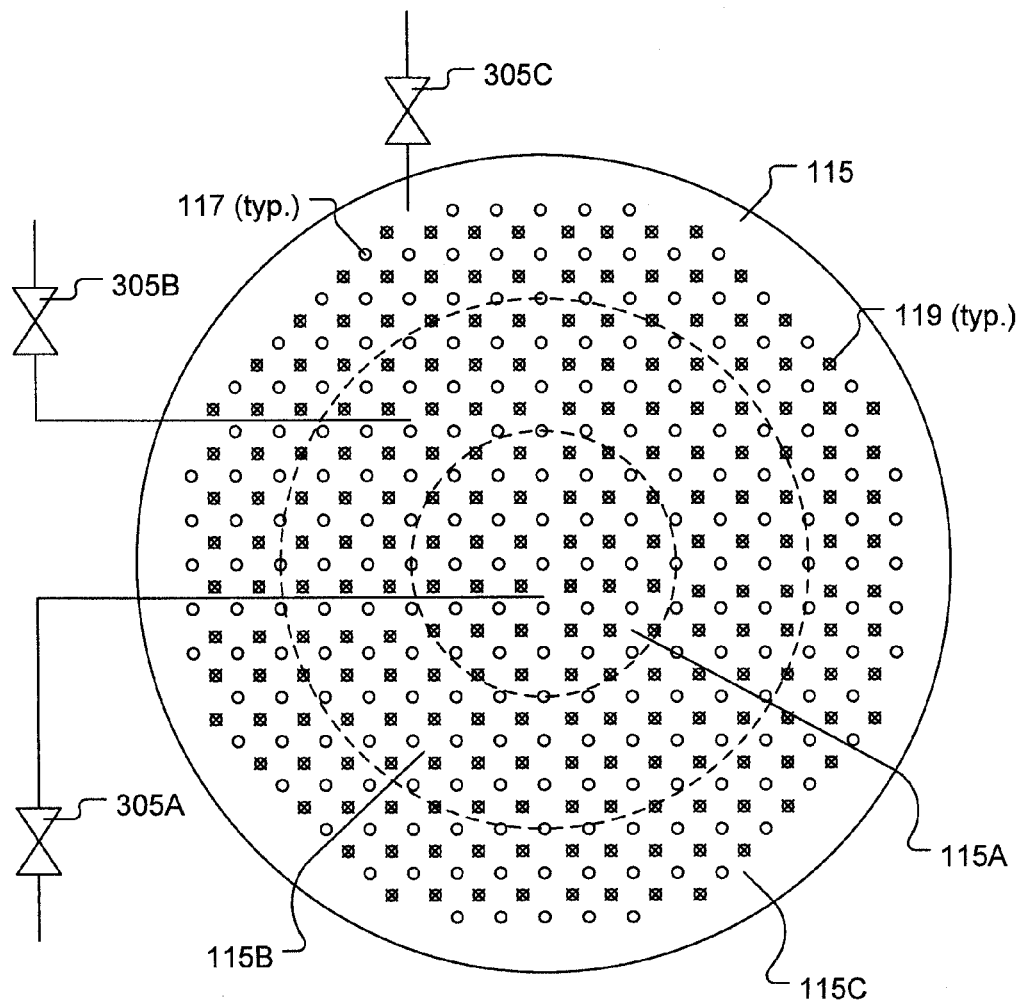
FIG. 3A shows a bottom view of the gas distribution unit, in accordance with one embodiment of the present invention.

FIG. 3A shows a bottom view of the gas distribution unit 115, in accordance with one embodiment of the present invention. Each of the gas supply ports 119 and through-holes 117 are defined in open fluid communication through the lower surface of the gas distribution unit 115. The arrangement of gas supply ports 119 is interspersed between the arrangement of through-holes 117. The gas supply ports 119 are plumbed through the gas distribution unit 115 to one or more plasma process gas supply sources 118, such that no direct fluid communication exists between the gas supply ports 119 and the through-holes 117 within the gas distribution unit 115.

Figure 3B:
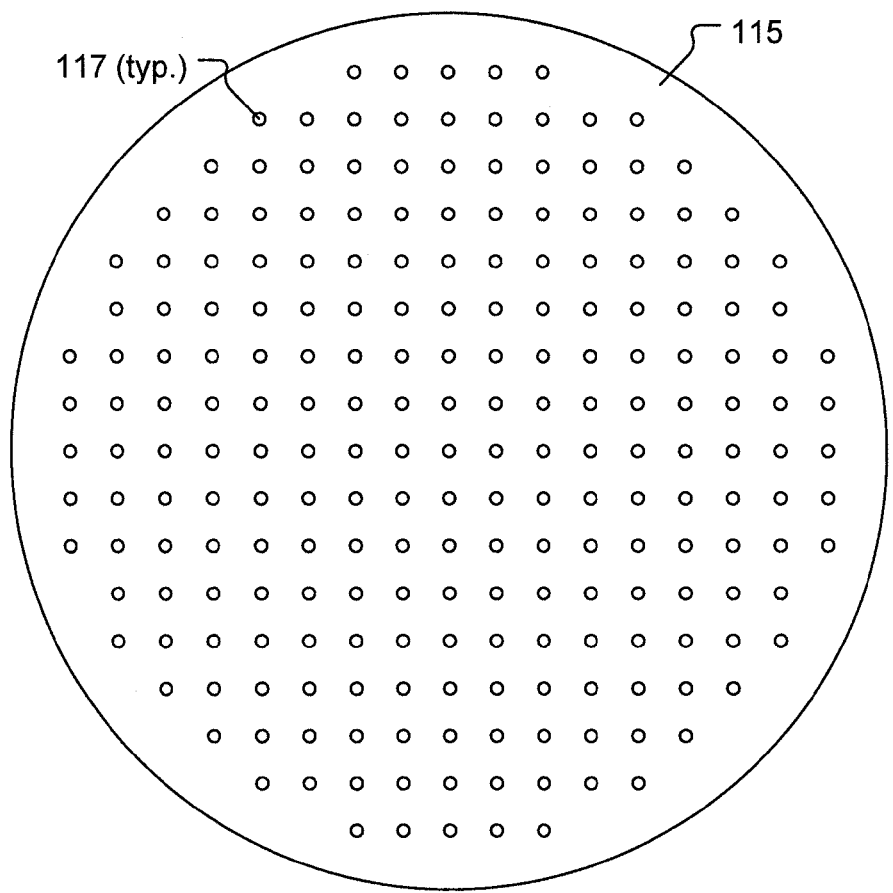
FIG. 3B shows a top view of the gas distribution unit, in accordance with one embodiment of the present invention.

FIG. 3B shows a top view of the gas distribution unit 115, in accordance with one embodiment of the present invention. Each of the through-holes 117 is defined in open fluid communication through the upper surface of the gas distribution unit 115. However, the gas supply ports 119 are not fluidly exposed through the upper surface of the gas distribution unit 115. Therefore, the gas supply ports 119 are defined to flow plasma process gas into only the lower plasma generation volume 109. In contrast, the through-holes 117 are defined to enable fluid communication between the upper and lower plasma generation volumes 103/109. Fluid flow through the through-holes 117 of the gas distribution unit 115 is controlled primarily by a pressure differential between the upper plasma generation volume 103 and the lower plasma generation volume 109.

It should be understood that the gas distribution unit 115 serves as a RF return path electrode, plasma process gas manifold, fluid flow baffle plate, and ion filter. In various embodiments the gas distribution unit 115 can be formed of metal that is a good conductor of electricity and heat, and that is chemically compatible with the processes to be conducted in the upper and lower plasma generation volumes 103/109, such as aluminum, stainless steel, silicon, silicon carbide, silicon oxide, yttrium oxide, or essentially any other material that provides adequate plasma resistance, electrical conduction, and thermal conduction for the plasma processes to which it is exposed.

In various embodiments, the gas distribution unit 115 is connected to its own DC bias source 124 and/or RF power source 122 to enable the gas distribution unit 115 to provide an appropriate ground return path for the RF power sources 105 and 111, while also providing appropriate bias to affect ions generated in the upper plasma generation volume 103. The RF power source 122 can also be defined to provide RF power at multiple frequencies. Additionally, in one embodiment, electrodes 130 are embedded within the gas distribution unit 115 and are connected to the DC bias source 124 to provide bias voltage for influencing ions generated in the upper plasma generation volume 103. In one embodiment, the embedded electrodes 130 within the gas distribution unit 115 are defined around the through-holes 117, such that bias voltage applied to the embedded electrodes 130 can be used to either accelerate or decelerate ions passing through the through-holes 117. Also, in one embodiment, the embedded electrodes 130 within the gas distribution unit 115 are defined in multiple separately controllable zones, with each zone connected to its own DC bias source 124. This embodiment enables independent regional biasing across the gas distribution unit 115, to provide for independent regional ion control across the gas distribution unit 115.

In one embodiment, portions of the gas distribution unit 115 that are exposed to plasma in either the upper or lower plasma generation volumes 103/109 are protected by a covering of plasma resistant material. In one embodiment, the plasma resistant material is formed as a coating. In another embodiment, the plasma resistant material is formed as a protective structure, e.g., plate, that conformally covers the gas distribution unit 115. In either of these embodiments, the plasma resistant material is secured to the gas distribution unit 115 to ensure adequate electrical and thermal conduction between the plasma resistant material and the gas distribution unit 115. In the embodiment of the plasma resistant protective structure, the protective structure may be secured to the gas distribution unit 115 by a pressure differential between the upper and lower plasma generation volumes 103/109, by a number of fasteners, or by a combination thereof. In various embodiments, the plasma resistant coating/protective structure used to protect the gas distribution unit 115 can be formed of silicon, silicon carbide, silicon oxide, yttrium oxide, or essentially any other material that provides adequate plasma resistance, electrical conduction, and thermal conduction for the plasma processes to which it is exposed.

The gas distribution unit 115 is defined as a swappable component. Different versions/configurations of the gas distribution unit 115 can be defined to have different arrangements of the gas supply ports 119 and through-holes 117. Additionally, in the event that plasma deteriorates the gas distribution unit 115 or its functionality, the gas distribution unit 115 can be replaced.

Each of the gas supply ports 119 and through-holes 117 is defined to optimize fluid flow through it, while simultaneously preventing adverse intrusion of plasma into it. Fluid flow and plasma intrusion through/into each of the gas supply ports 119 and though-holes 117 is directly proportional to its size. Therefore, it is necessary to define each of the gas supply ports 119 and though-holes 117 such that its size is small enough to prevent adverse plasma intrusion into it, while remaining large enough to provide adequate fluid flow through it. In various embodiments, the diameter of the gas supply ports 119 is sized within a range extending from about 0.1 mm to about 3 mm. In various embodiments, the diameter of the through-holes 117 is sized within a range extending from about 0.5 mm to about 5 mm. It should be understood, however, that in various embodiments the gas supply ports 119 and through-holes 117 can be respectively defined with essentially any diameter size, so long as the diameter size provides for adequate fluid flow there through while simultaneously providing for adequate suppression of plasma intrusion therein.

Figure 3C:
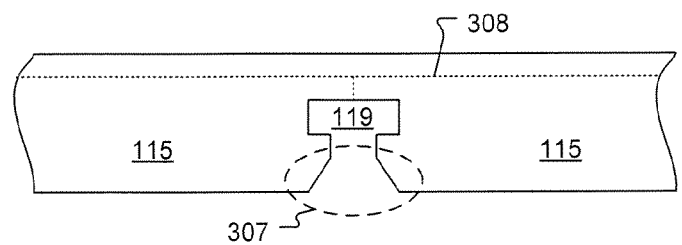
FIG. 3C shows a gas supply port cross-section, in accordance with one embodiment of the present invention.

Because the fluid flow pressure to the gas supply ports 119 is directly controllable, it is possible to define the gas supply ports 119 to have a small enough size to essentially prevent plasma intrusion into the gas supply ports 119. However, it is appropriate to avoid defining the gas supply ports 119 so small as to cause supersonic fluid flow through the gas supply ports 119. To avoid supersonic fluid flow from the gas supply ports 119, the gas supply ports 119 can be defined to have a diffuser shape at their exit from the lower surface of the gas distribution unit 115. FIG. 3C shows a gas supply port 119 cross-section, in accordance with one embodiment of the present invention. The gas supply port 119 is shown to have a diffuser shape 307 at its exit location from the gas distribution unit 115.

The gas distribution unit 115 includes interior gas supply channels 126 fluidly connected to the arrangement of gas supply ports 119. These interior gas supply channels 126 are fluidly connected to one or more plasma process gas supply sources 118. It should be understood that the interior gas supply channels 126 and associated gas supply ports 119 are defined between the arrangement of through-holes 117 such that the plasma process gas is distributed to the lower plasma generation volume 109 and is not distributed to the upper plasma generation volume 103. In one embodiment, the plasma process gas supply sources 118 for the lower plasma generation volume 109 are separate from the plasma process gas supply sources 116 for the upper plasma generation volume 103, such that flow rates of plasma process gases to the upper and lower plasma generation volumes 103/109 are independently controllable. In one embodiment, one or more shared plasma process gas supply sources can be used for both the upper and lower plasma generation volumes 103/109. However, in this embodiment, the plasma process gas flows from each shared plasma process gas supply is separately controlled for each of the upper and lower plasma generation volumes 103/109, respectively. Also, it should be understood that in some embodiments the gas supply sources 118 represent multiple gas supplies and/or gas boxes that provide for selection of appropriate gases and/or gas mixtures for flow through the gas distribution unit 115.

In one embodiment, such as depicted in FIG. 3A, the interior gas supply channels 126 within the gas distribution unit 115 are defined to fluidly separate the arrangement of gas supply ports 119 into multiple concentric regions/zones 115A, 115B, 115C across the lower surface of the gas distribution unit 115, such that flow rates of the plasma process gas to the gas supply ports 119 within each of the multiple concentric regions/zones 115A, 115B, 115C can be separately controlled. In one embodiment, the gas supply ports 119 within each concentric radial region/zone 115A, 115B, 115C are plumbed to a respective gas flow control device 305A, 305B, 305C, such that supply of the plasma process gas to each concentric radial region/zone 115A, 115B, 115C is independently controllable.

Separation of the gas supply ports 119 into independently controllable multiple concentric regions/zones 115A, 115B, 115C provides for center-to-edge gas supply control within the lower plasma generation volume 109, which in turn facilitates center-to-edge plasma uniformity control within the lower plasma generation volume 109. Although the example embodiment of FIG. 3A shows three concentric gas supply regions/zones 115A, 115B, 115C, it should be understood that the gas distribution unit 115 can be defined to include more or less independently controllable gas supply regions/zones. For example, in another embodiment, the gas distribution unit 115 is defined to include two independently controllable concentric gas supply regions/zones.

In one embodiment, the number of through-holes 117 is larger than the number gas supply ports 119, to provide for adequate radical/neutral flow from the upper plasma generation volume 103 to the lower plasma generation volume 109. Also, the through-holes 117 can be defined to have a larger size than the gas supply ports 119, to provide for adequate radical/neutral flow from the upper plasma generation volume 103 to the lower plasma generation volume 109. However, as previously discussed, the size of the through-holes 117 is limited to prevent adverse plasma intrusion from either the upper or lower plasma generation volumes 103/109 into the through-holes 117.

Figure 3D:
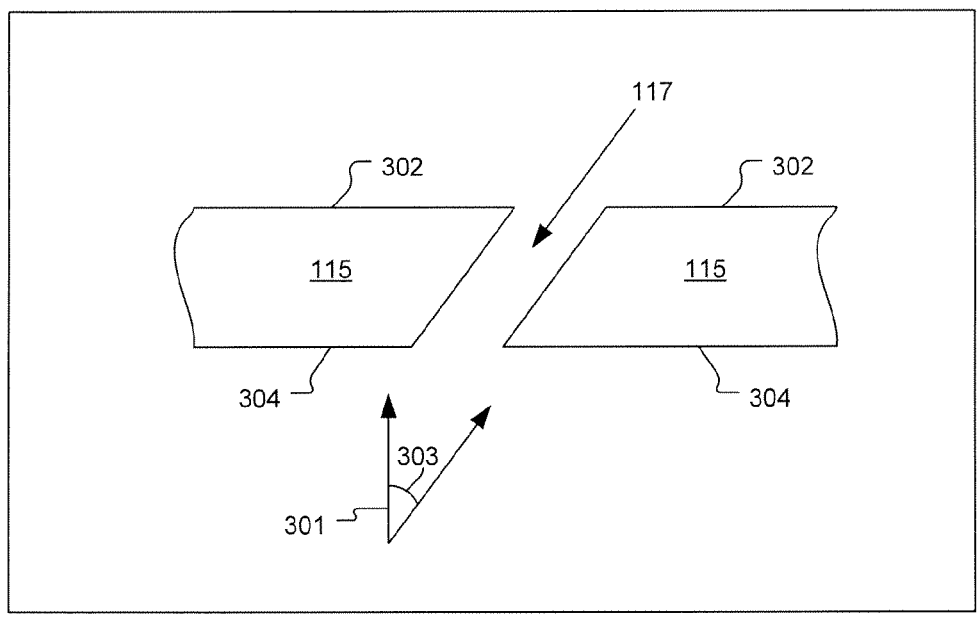
FIG. 3D shows a cross-section of a through-hole defined to extend through the gas distribution unit and an angle, in accordance with one embodiment of the present invention.

In one embodiment, some or all of the through-holes 117 are defined to extend at an angle through the gas distribution unit. FIG. 3D shows a cross-section of a through-hole 117 defined to extend through the gas distribution unit 115 and an angle 303, in accordance with one embodiment of the present invention. The through-hole 117 is defined to extend from the upper surface 302 of the gas distribution unit 115 to the lower surface 304 of the gas distribution unit 115 at the angle 303 offset from a reference direction 301 that extends perpendicularly between the upper and lower surfaces 302/304 of the gas distribution unit 115.

The through-holes 117 are angled to increase the probability that charged constituents, i.e., ions, within the upper plasma generation volume 103 will encounter the electrically grounded gas distribution unit 115 as they travel through the through-hole 117, so as to be removed from radical/neutral flux passing through the gas distribution unit 115 by way of the through-holes 117. In one embodiment, the angle 303 is sufficiently large to prevent an uninterrupted line-of-sight within the through-hole 117 through the gas distribution unit 115 in the reference direction 301.

In one embodiment, all through-holes 117 within the gas distribution unit 115 are angled to ensure that essentially none of the ions generated within the upper plasma generation volume 103 are allowed to pass through the gas distribution unit 115 to the lower plasma generation volume 109. This embodiment provides for an essentially pure radical/neutral flux introduction into the lower plasma generation volume 109 by way of the through-holes 117. In another embodiment, a portion of the through-holes 117 are angled with a remainder of through-holes 117 defined to extend in a substantially straight manner coincident with the reference direction 301. This embodiment provides for some ions to be mixed with the radical/neutral flux that flows from the upper plasma generation volume 103 to the lower plasma generation volume 109. In this embodiment, the number and distribution of straight through-holes 117 relative to angled through-holes 117 can be defined to achieve a desired ion concentration within the radical/neutral flux.

Figure 4A:
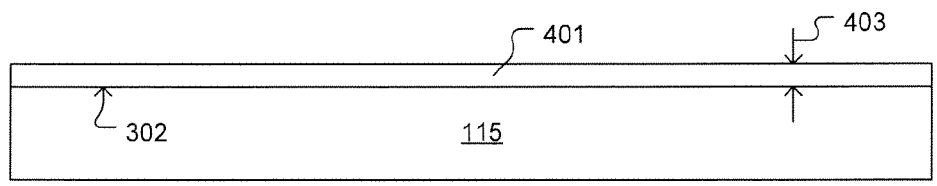
FIG. 4A shows a flow control plate disposed on the upper surface of the gas distribution unit, in accordance with one embodiment of the present invention.

In one embodiment, a flow control plate is disposed on the upper surface of the gas distribution unit 115 to control which through-holes 117 are exposed to the upper plasma generation volume 103. FIG. 4A shows a flow control plate 401 disposed on the upper surface 302 of the gas distribution unit 115, in accordance with one embodiment of the present invention. In one embodiment, the flow control plate 401 is defined as a disc having a thickness 403 within a range extending from about 3 mm to about 6 mm. The flow control plate 401 disc is defined to have a diameter sufficient to cover the through-holes 117 through which flow is to be controlled. In one embodiment, the flow control plate 401 disc is defined to have a diameter that covers the upper surface of the gas distribution unit 115 so as to maintain a uniform exposure of the plasma in the upper plasma generation volume 103 to the RF return path provided by the gas distribution unit 115.

In one embodiment, the flow control plate 401 is formed of an electrically and thermally conductive material, and is secured to the gas distribution unit 115 to ensure adequate electrical and thermal conduction between the flow control plate 401 and the gas distribution unit 115. In one embodiment, the flow control plate 401 may be secured to the gas distribution unit 115 by a pressure differential between the upper and lower plasma generation volumes 103/109, by a number of fasteners, or by a combination thereof. Also, in various embodiments, the flow control plate 401 can be covered and protected by a plasma resistant coating such as that discussed above with regard to the gas distribution unit 115.

In one embodiment, multiple patterns of holes are defined through the flow control plate 401. Each of the multiple patterns of holes within the flow control plate 401 aligns with a different set of through-holes 117 within the gas distribution unit 115. Disposal of the flow control plate 401 on the upper surface of the gas distribution unit 115 at a particular rotational position of the flow control plate 401 relative to the upper surface of the gas distribution unit 115 corresponds to alignment of a particular one of the multiple patterns of holes within the flow control plate 401 with its corresponding set of through-holes 117 within the gas distribution unit 115. Each of the multiple patterns of holes that extends through the flow control plate 401 is defined to expose a different number or a different spatial pattern of through-holes 117 within the gas distribution unit 115. Therefore, radical/neutral flow through the flow control plate 401, and hence through the gas distribution unit 115, can be controlled by setting the flow control plate 401 at a particular rotational position relative to the upper surface of the gas distribution unit 115.

Figure 4B:
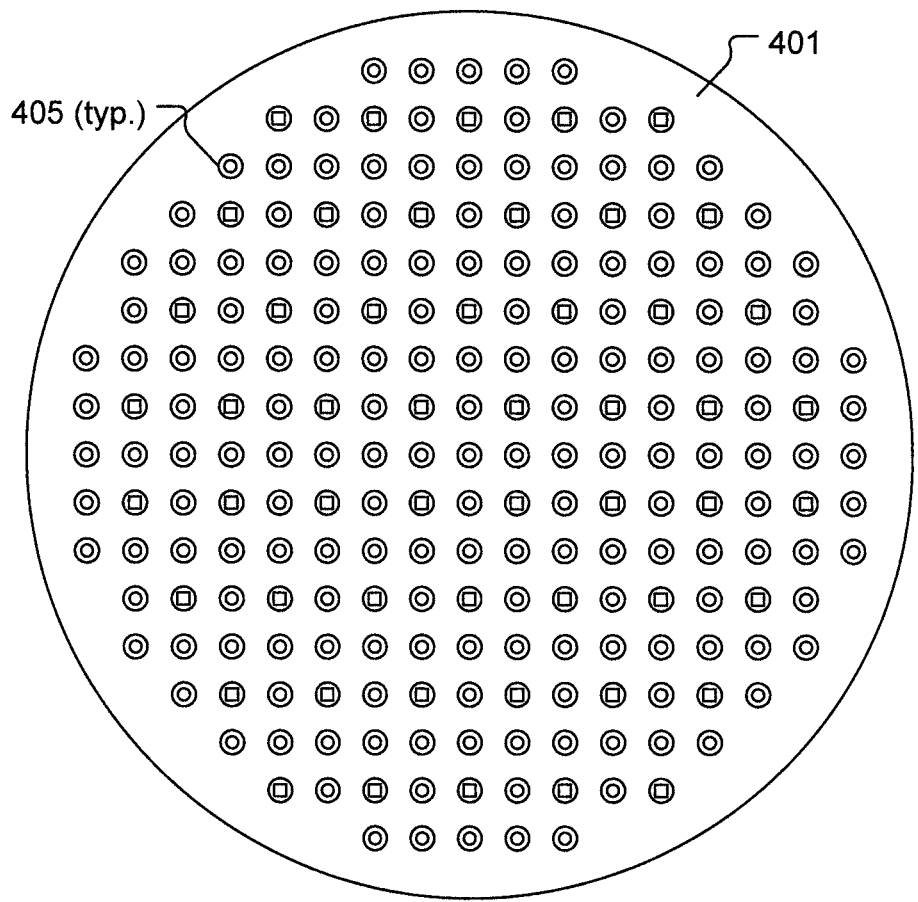
FIG. 4B shows a top view of the flow control plate positioned such that a hole pattern defined therein allows for flow through all through-holes defined within the underlying gas distribution unit, in accordance with one embodiment of the present invention.
Figure 4C:
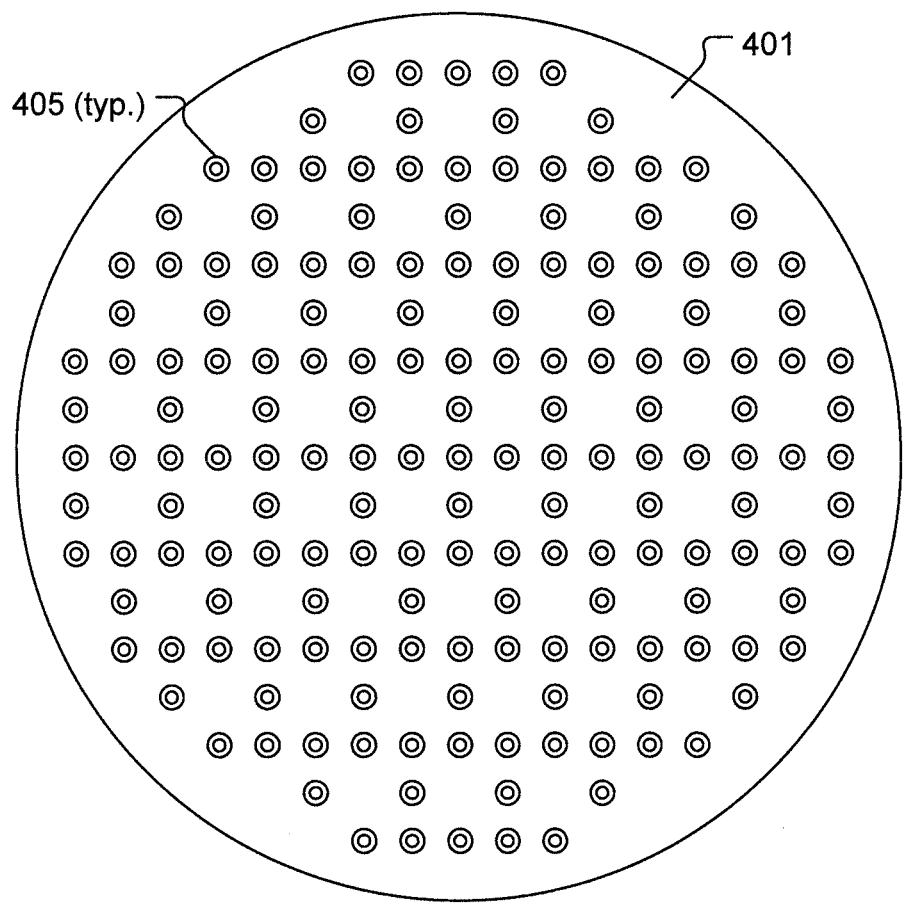
FIG. 4C shows a top view of the flow control plate positioned such that the hole pattern defined therein allows for flow through only angled through-holes defined within the underlying gas distribution unit, in accordance with one embodiment of the present invention.

In one embodiment, the flow control plate 401 is defined to include a pattern of holes that provides for shutoff of the through-holes 117 that extend straight through the gas distribution unit 115 in the reference direction 301, thereby enabling shutoff of ion flow through the gas distribution unit 115. FIG. 4B shows a top view of the flow control plate 401 positioned such that a hole 405 pattern defined therein allows for flow through all through-holes 117 defined within the underlying gas distribution unit 115, in accordance with one embodiment of the present invention. FIG. 4C shows a top view of the flow control plate 401 positioned such that the hole 405 pattern defined therein allows for flow through only angled through-holes 117 defined within the underlying gas distribution unit 115, in accordance with one embodiment of the present invention. Also, in other embodiments, the multiple patterns of holes 405 in the flow control plate 401 are defined to provide for different spatial patterns of radical/neutron flow through the gas distribution unit 115.

Figure 4D:
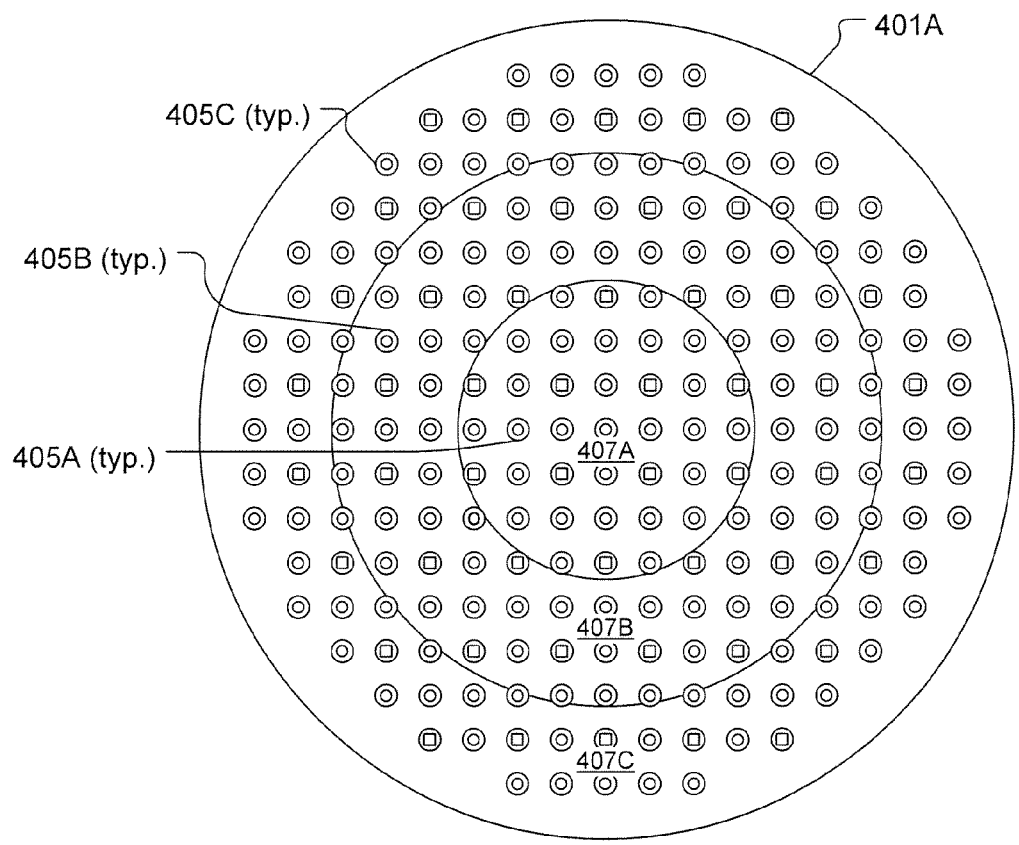
FIG. 4D shows a top view of a flow control plate assembly defined by a number of concentric rotatable flow control plates, in accordance with one embodiment of the present invention.

FIG. 4D shows a top view of a flow control plate assembly 401A defined by a number of concentric rotatable flow control plates 407A, 407B, 407C, in accordance with one embodiment of the present invention. Each concentric rotatable flow control plate 407A, 407B, 407C can be set independently to provide center-to-edge control over which through-holes 117 are open or closed within the gas distribution unit 115. Specifically, the flow control plate assembly 401A includes a central disc 407A and a number of concentric rings 407B/407C, disposed in a concentric manner on the upper surface of the gas distribution unit 115. It should be understood that the particular configuration of FIG. 4D is provided by way of example. Other embodiments may include a different number of concentric rotatable flow control plates than what is shown in FIG. 4D.

Each of the central disc 407A and the number of concentric rings 407B/407C respectively include multiple patterns of holes 405A/405B/405C extending there through. Each of the multiple patterns of holes 405A/405B/405C aligns with a different set of through-holes 117 within the gas distribution unit 115, such that disposal of each of the central disc 407A and the concentric rings 407B/407C on the upper surface of the gas distribution unit 115, at a particular rotational position relative to the upper surface of the gas distribution unit 115, corresponds to alignment of a particular one of the multiple patterns of holes 405A/405B/405C with its corresponding set of through-holes 117 within the gas distribution unit 115. Each of the multiple patterns of holes 405A/405B/405C extending through the central disc 407A and the concentric rings 407B/407C is defined to expose a different number or a different spatial pattern of through-holes 117 within the gas distribution unit 115.

With reference back to FIG. 1, a chuck 107 is disposed within the interior cavity 100D of the chamber 100 below the lower plasma generation volume 109. In one embodiment, the chuck 107 is cantilevered from the wall 100C of the chamber 100. In one embodiment, the chuck 107 is an electrostatic chuck and provides an electrode for transmitting RF power to the lower plasma generation volume 109. The chuck 107 is defined to hold a substrate 113, i.e., wafer 113, in exposure to the lower plasma generation volume 109. In one embodiment, a wafer edge ring 149 is disposed on the chuck 107 about the periphery of a substrate 113 receiving/holding area on the chuck 107. In various embodiments, the wafer edge ring is formed of quartz or silicon. Also, in one embodiment, a conductor 148 is disposed below the wafer edge ring 149, and is connected to drive DC bias through the wafer edge ring 149. The chuck 107 is also defined to include a configuration of cooling channels and/or heating elements, so as to enable temperature control of the substrate 113 and the lower plasma generation volume 109.

The chuck 107 is defined to move vertically within the interior cavity 100D, as indicated by arrows 123. In this manner, the chuck 107 can be lowered to receive/provide the substrate 113 through the gate valve 102, and can be raised to form the lower surface of the lower plasma generation volume 109. Also, a vertical distance across the lower plasma generation volume 109, as measured perpendicular to both the chuck 107 and the gas distribution unit 115, can be set and controlled by controlling the vertical position of the chuck 107. The vertical distance across the lower plasma generation volume 109 can be set to achieve a sufficient center-to-edge plasma uniformity and density, and can also be set to avoid printing on the wafer 113 by jets of gas flowing from the gas supply ports 119 and/or through-holes 117. In various embodiments, the vertical distance across the lower plasma generation volume 109 can be set within a range extending from about 1 cm to about 5 cm, or from about 2 cm to about 3.6 cm.

The chuck 107 is further defined to supply RF power from an RF power source 111 to the lower plasma generation volume 109, such that chuck 107 serves as an electrode for the lower plasma generation volume 109. It should be understood that the RF power source 111 of the lower plasma chamber is separate and independent from the RF power source 105 of the upper plasma chamber. Therefore, the RF power supplied to the upper and lower plasma generation volumes 103/109 can be separately and independently controlled. In one embodiment, the RF power source 111 is defined to provide RF power and multiple frequencies. For example, the RF power source 111 can be defined to provide RF power at frequencies of 2 MHz, 27 MHz, and 60 MHz. It should be understood that each of the RF power sources 105/111 for the upper and lower plasma chambers 112/114, respectively, are connected through their own matching networks to enable transmission of the RF power to the showerhead electrode 101 and the chuck 107, respectively. As previously discussed, in one embodiment, the gas distribution unit 115 serves as a reference ground electrode in the RF power return path for both the upper and lower plasma generation volumes 103/109.

The upper plasma chamber is defined to include an exhaust channel 125 through which gases within the upper plasma generation volume 103 are exhausted into the interior cavity 100D of the chamber 100. The exhaust channel 125 is defined to circumscribe the upper plasma generation volume 103 outside a radial periphery of the showerhead electrode 101 and outside of a radial periphery of the gas distribution unit 115. In this configuration, the exhaust channel 125 extends in a radial direction between a lower surface of the outer structural member 104 of the upper plasma chamber and upper surfaces of both the gas distribution unit 115 and outer structural member 106 of the lower plasma chamber.

A pressure throttle ring 127 is defined to move within the exhaust channel 125 to throttle a fluid flow, i.e., flow of gases, from the upper plasma generation volume 103 through the exhaust channel 125 to the interior cavity 100D of the chamber 100. In one embodiment, the pressure throttle ring 127 is defined to move vertically within a conformally defined recessed region within the outer structural member 104 of the upper plasma chamber 112. In this embodiment, the pressure throttle ring 127 can be moved in a controlled manner down into the exhaust channel 125 to reduce a flow area through the exhaust channel 125 and thereby throttle the fluid flow from the upper plasma generation volume 103. In one embodiment, the pressure throttle ring 127 is defined to enable a complete shutoff of flow from the upper plasma generation volume 103 through the exhaust channel 125 into the interior cavity 100D of the chamber 100.

It should be understood that the pressure throttle ring 127 configuration depicted in FIG. 1 is one example embodiment of its implementation. In other embodiments, the pressure throttle ring 127 can be implemented in different ways, so long as the pressure throttle ring 127 provides for control of fluid flow through the exhaust channel 125. Also, in one embodiment, a pressure manometer is disposed to measure the pressure within the upper plasma generation volume 103. In this embodiment, this measured pressure within the upper plasma generation volume 103 is used to generate feedback signals for controlling the position of the pressure throttle ring 127, which in turn provides active control of the pressure within the upper plasma generation volume 103.

The lower plasma chamber is defined to include a set of slotted exhaust channels 129 through which gases within the lower plasma generation volume 109 are exhausted into the interior cavity 100D of the chamber 100. The set of slotted exhaust channels 129 is defined to circumscribe the lower plasma generation volume 109 outside a radial periphery of the chuck 107 and outside of a radial periphery of the gas distribution unit 115. In one embodiment, as depicted in FIG. 1, the set of slotted exhaust channels 129 is defined in a horizontally oriented portion of the outer structural member 106 of the lower plasma chamber 114 located at a vertical position near a top surface of the chuck 107 upon which the substrate 113 is held. In this embodiment, the set of slotted exhaust channels 129 extends vertically through the horizontally oriented portion of the outer structural member 106 of the lower plasma chamber 114.

A pressure control ring 131 is defined to move toward and away from the set of slotted exhaust channels 129 to throttle a fluid flow, i.e., flow of gases, from the lower plasma generation volume 109 through the set of slotted exhaust channels 129 into the interior cavity 100D of the chamber 100. In one embodiment, the pressure control ring 131 is defined as a horizontally oriented annular-shaped disc which is movable in a vertical direction toward and away from the set of slotted exhaust channels 129. The pressure control ring 131 is defined to cover the set of slotted exhaust channels 129 (on the interior cavity 100D side) when placed against the set of slotted exhaust channels 129, i.e., when placed against a lower surface of the horizontally oriented portion of the outer structural member 106 within which the set of slotted exhaust channels 129 is formed.

Fluid flow from the lower plasma generation volume 109 through the set of slotted exhaust channels 129 to the interior cavity 100D of the chamber 100 can be throttled, i.e., controlled, through vertical movement of the pressure control ring 131 toward and away from the set of slotted exhaust channels 129. In one embodiment, the pressure control ring 131 is defined to enable a complete shutoff of flow from the lower plasma generation volume 109 through the set of slotted exhaust channels 129 into the interior cavity 100D of the chamber 100. Also, in one embodiment, a pressure manometer is disposed to measure the pressure within the lower plasma generation volume 109. In this embodiment, this measured pressure within the lower plasma generation volume 109 is used to generate feedback signals for controlling the position of the pressure control ring 131, which in turn provides active control of the pressure within the lower plasma generation volume 109.

It should be understood that both the upper plasma chamber 112 and the lower plasma chamber 114 enclose respective confined plasmas. A confined plasma is beneficial in that its residence time can be controlled by controlling volume, pressure, and flow within the plasma region, i.e., within the upper and lower plasma generation volumes 103/109. The plasma residence time affects the dissociation process, which is a factor in radical/neutron formation. The upper and lower plasma generation volumes 103/109 are small and well-controlled with regard to pressure and temperature.

As previously discussed, the upper and lower plasma chambers 112/114 have their own respective RF power sources/controls, pressure controls, temperature controls, plasma process gas sources/controls, and gas flow controls. In various embodiments, a pressure within the upper plasma processing volume 103 can be controlled within a range extending from about 100 mTorr to about 1 Torr, or from about 200 mTorr to about 600 mTorr. In various embodiments, a pressure within the lower plasma processing volume 109 can be controlled within a range extending from about 5 mTorr to about 100 mTorr, or from about 10 mTorr to about 30 mTorr.

Figure 5:
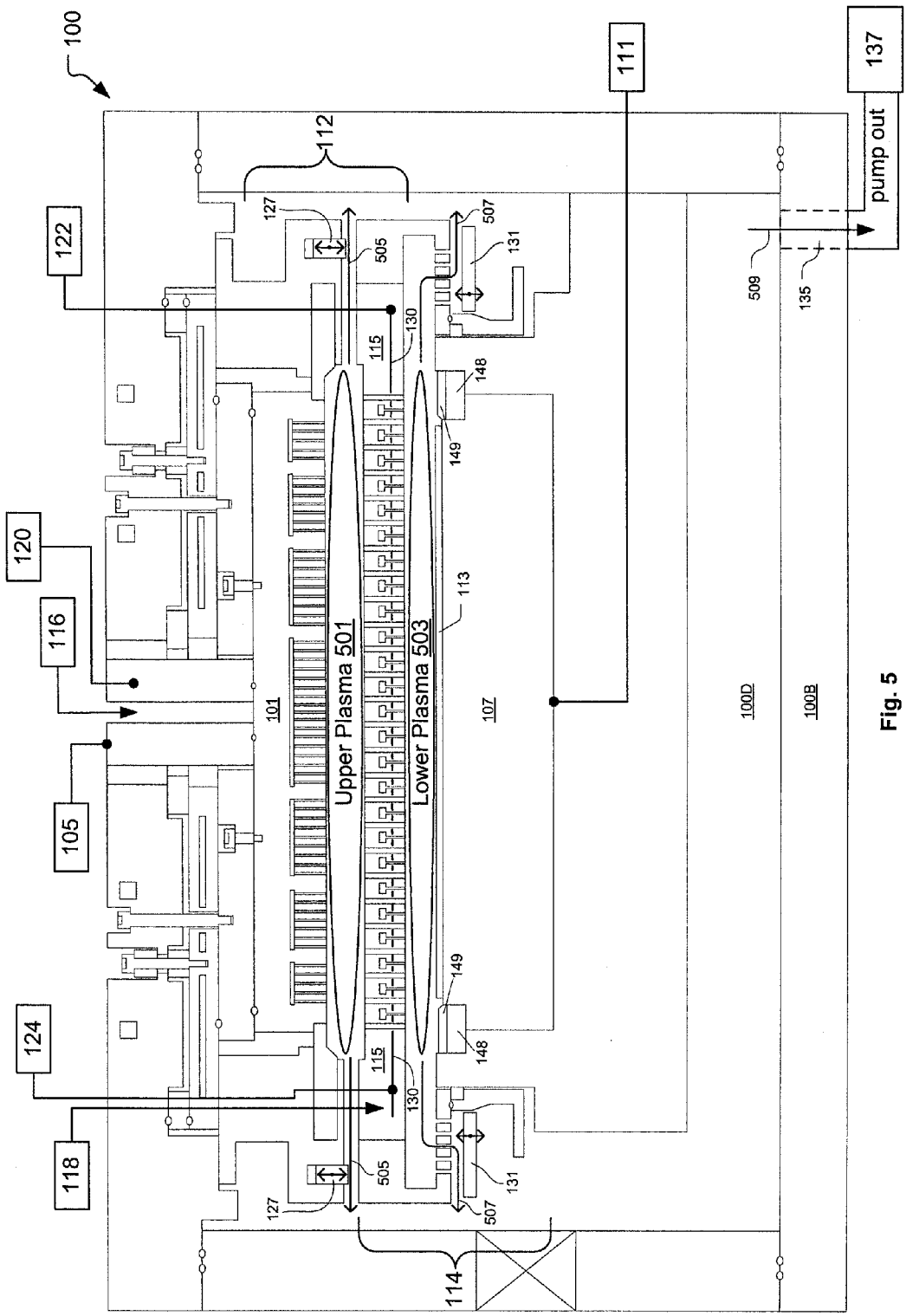
FIG. 5 shows the chamber of FIG. 1 with an upper plasma and a lower plasma, in accordance with one embodiment of the present invention.

FIG. 5 shows the chamber 100 of FIG. 1 with an upper plasma 501 and a lower plasma 503, in accordance with one embodiment of the present invention. The process gases from the upper plasma 501 are exhausted from the upper plasma generation volume 103 through the exhaust channel 125 into the interior cavity 100D of the chamber 100, as indicated by arrows 505. The process gases from the lower plasma 503 are exhausted from the lower plasma generation volume 109 through the set of slotted exhaust channels 129 into the interior cavity 100D of the chamber 100, as indicated by arrows 507. Process gases are exhausted from the interior cavity 100D of the chamber 100 through the exhaust port 135 as indicated by arrow 509.

It should be understood that the independent control of the upper and lower plasma chambers 112/114 provides for extensive possibilities with regard to wafer processing recipes, particularly concerning the independent control of radical/neutral flux relative to ion flux. A couple of example wafer processes are provided below. However, it should be understood that the example wafer processes disclosed herein are provided as examples only and in no way represent any limitation on use of the dual plasma processing chamber 100 disclosed herein.

In one example embodiment, the chamber 100 is used to perform a wafer process that utilizes high fluorine radical/neutral flux with low dissociation of CxFy (C4F8, C4F6, etc.) in the wafer processing plasma. In this example embodiment, a mixture of Ar and NF3 is supplied as the plasma process gas to the upper plasma generation volume 103. The upper plasma generation volume 103 is operated at high pressure and high RF frequency (60 MHz). The high fluorine radical/neutral flux is generated in the upper plasma generation volume 103 and is flowed through the through-holes 117 of the gas distribution unit 115. The ions generated in the upper plasma processing volume 103 are filtered by the gas distribution unit 115.

Also, in this example embodiment, a mixture Ar and CxFy gas is supplied as the plasma process gas to the lower plasma generation volume 109. The lower plasma generation volume 109 is operated at low pressure and low to medium RF frequency (2 MHz and 27 MHz). The low RF frequency of the lower plasma generation volume 109 corresponds to low dissociation of CxFy in the plasma exposed to the wafer 113. It should be appreciated that the high power required in the upper plasma generation volume 103 to generate the necessary fluorine radical/neutral flux would cause high dissociation of CxFy if applied to the lower plasma generation volume 109. Therefore, the dual plasma chamber 100 enables performance of the above described process.

In another example embodiment, the chamber 100 is used to perform a wafer process that utilizes high dissociation of CxFy (C4F8, C4F6, etc.) in a high pressure volume with a high density Ar plasma in a low pressure volume. In this example embodiment, a mixture of CxFy and Ar is supplied as the plasma process gas to the upper plasma generation volume 103. The upper plasma generation volume 103 is operated at high pressure and high RF frequency (60 MHz) to cause high dissociation of CxFy. The highly dissociated CxFy generated in the upper plasma generation volume 103 flows through the through-holes 117 of the gas distribution unit 115. The ions generated in the upper plasma processing volume 103 are filtered by the gas distribution unit 115. Also, in this example embodiment, Ar gas is supplied as the plasma process gas to the lower plasma generation volume 109. The lower plasma generation volume 109 is operated at low pressure and low to medium RF frequency (2 MHz and 27 MHz) to generate a high density Ar plasma with high ion flux.

In one operational embodiment, the pressure control ring 131 of the lower plasma chamber 114 is closed, and the upper plasma chamber 112 is set in an exhaust only configuration. In this embodiment, a plasma is not generated in the upper plasma generation volume 103. In this embodiment, plasma process gas flows through the gas supply ports 119 of the gas distribution unit 115 into the lower plasma generation volume 109. Also in this embodiment, plasma process gas exhausts from lower plasma generation volume 109 through the through-holes 117 of the gas distribution unit 115 into the upper plasma generation volume 103, and then out the exhaust channel 125 into the interior cavity 100D of the chamber 100.

This operational embodiment provides for axial pump in and pump out of plasma process gases to/from the lower plasma generation volume 109. In this embodiment, accurate pressure uniformity control can be achieved across the wafer 113, because gases are pumped out vertically as opposed to radially. It should be appreciated that radial pump out of exhaust gases causes a radial pressure distribution across wafer 113. This embodiment also allows for accurate control of residence time in low flow applications, such as atomic layer deposition or atomic layer etching in which short plasma residence time, e.g., less than a millisecond, is required.

It should be appreciated that the dual plasma chamber 100 is defined to decouple radical/neutral flux generation/application from ionic plasma generation/application. Also, in one embodiment, the lower plasma chamber 114 can be inactive, i.e., exhaust only, such that radical/neutral flux from the upper plasma chamber 112 can be applied to the wafer 113 without exposing the wafer 113 to a plasma.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A semiconductor wafer processing apparatus, comprising:
  a first electrode exposed to a first plasma generation volume, the first electrode defined to transmit radiofrequency (RF) power to the first plasma generation volume, the first electrode further defined to distribute a first plasma process gas to the first plasma generation volume;
  a second electrode exposed to a second plasma generation volume, the second electrode defined to transmit RF power to the second plasma generation volume, the second electrode further defined to hold a substrate in exposure to the second plasma generation volume;
  a gas distribution unit disposed between the first plasma generation volume and the second plasma generation volume, the gas distribution unit defined to include an arrangement of through-holes that each extend through the gas distribution unit to fluidly connect the first plasma generation volume to the second plasma generation volume, the gas distribution unit further defined to include interior gas supply channels fluidly connected to an arrangement of gas supply ports defined to distribute a second plasma process gas to the second plasma generation volume, wherein the gas distribution unit includes embedded electrodes defined around the through-holes and around portions of the gas supply ports and below horizontal portions of the interior gas supply channels, each of the embedded electrodes defined to connect with any one of one or more direct current bias sources external to the gas distribution unit; and
  an exhaust channel configured to circumscribe the first plasma generation volume outside of a radial periphery of the first electrode and outside of a radial periphery of the gas distribution unit.

2. The apparatus of claim 1, wherein the first electrode is defined to include a number of gas supply ports arranged in a number of concentric radial zones facing toward the first plasma generation volume, wherein the gas supply ports within each concentric radial zone are plumbed to a respective gas flow control device, such that the first plasma process gas supply to each concentric radial zone is independently controlled.

3. The apparatus of claim 1, wherein the first electrode forms an upper surface of the first plasma generation volume, and wherein the second electrode forms a lower surface of the second plasma generation volume, and wherein the gas distribution unit is defined as a plate formed to separate the first plasma generation volume from the second plasma generation volume, such that an upper surface of the plate provides a lower boundary of the first plasma generation volume, and such that a lower surface of the plate provides an upper boundary of the second plasma generation volume, wherein each of the through-holes extend through the plate from the upper surface of the plate to the lower surface of the plate.

4. The apparatus of claim 1, wherein the interior gas supply channels are defined to fluidly separate the arrangement of gas supply ports into multiple concentric regions across the lower surface of the plate, such that flow rates of the second plasma process gas to the gas supply ports within each of the multiple concentric regions is independently controlled.

5. The apparatus of claim 1, wherein the gas distribution unit is formed of an electrically conductive material and is electrically connected to a reference ground potential such that the gas distribution unit provides a ground electrode for both the first and second plasma generation volumes.

6. The apparatus of claim 1, wherein the first electrode is electrically connected to a first RF power source, and wherein the second electrode is electrically connected to a second RF power source separate from the first RF power source.

7. The apparatus of claim 1, wherein the second electrode is defined to hold the substrate through electrostatic attraction.

8. The apparatus of claim 1, wherein the second electrode is movable in a direction toward and away from the gas distribution unit to provide for control of a distance extending across the second plasma generation volume perpendicular to both the second electrode and gas distribution unit.

9. The apparatus of claim 1, further comprising:
a pressure throttle ring configured to move in a controlled manner within the exhaust channel to throttle a flow of gas from the first plasma generation volume through the exhaust channel.

10. The apparatus of claim 9, further comprising:
a pressure measuring device disposed to measure a pressure within the first plasma generation volume; and
a feedback control mechanism defined to control a position of the pressure throttle ring within the exhaust channel based on measured pressure within the first plasma generation volume obtained from the pressure measuring device.

11. The apparatus of claim 9 wherein the second plasma generation volume is defined to exhaust through a set of slotted channels defined to circumscribe the second plasma generation volume outside of a radial periphery of the second electrode and outside of a radial periphery of the gas distribution unit, the semiconductor wafer processing apparatus further comprising a pressure control ring defined to cover the set of slotted channels when placed against the set of slotted channels, the pressure control ring defined to move toward and away from the set of slotted channels to throttle a flow of gas from the second plasma generation volume through the set of slotted channels.

12. The apparatus of claim 11, further comprising:
a pressure measuring device disposed to measure a pressure within the second plasma generation volume; and
a feedback control mechanism defined to control a position of the pressure control ring relative to the set of slotted channels based on measured pressure within the second plasma generation volume obtained from the pressure measuring device.

13. The apparatus of claim 1, wherein each through-hole is defined to extend from an upper surface of the gas distribution unit exposed to the first plasma generation volume to a lower surface of the gas distribution unit exposed to the second plasma generation volume at an angle offset from a reference direction that extends perpendicularly between the upper and lower surfaces of the gas distribution unit, wherein the angle is sufficiently large to prevent an uninterrupted line-of-sight through the gas distribution unit in the reference direction at each through-hole location.

14. The apparatus of claim 1, wherein the embedded electrodes located within the gas distribution unit are defined in multiple separately controllable zones, with each zone connected to a separate direct current bias source.

15. The apparatus of claim 1, wherein the exhaust channel is configured to extend in a radial direction away from the first plasma generation volume so as to extend over a total radial distance as measured in a direction parallel to both a bottom surface of the first electrode and a top surface of the gas distribution unit, the exhaust channel having a top surface and a bottom surface, each of the top and bottom surfaces of the exhaust channel oriented parallel to both the bottom surface of the first electrode and the top surface of the gas distribution unit along the total radial distance over which the exhaust channel extends, the top surface of the exhaust channel positioned below the bottom surface of the first electrode, the bottom surface of the exhaust channel positioned at or above the top surface of the gas distribution unit, the exhaust channel having a vertical size measured perpendicularly between the top and bottom surfaces of the exhaust channel, the vertical size of the exhaust channel less than a vertical size of the first plasma generation volume as measured perpendicularly between the bottom surface of the first electrode and the top surface of the gas distribution unit.

16. A system for semiconductor wafer processing, comprising:
a chamber defined to have an interior cavity and an exhaust port that provides for fluid connection of the interior cavity to an exhaust pump;
a dual plasma processing apparatus disposed within the interior cavity of the chamber and including,
an upper plasma chamber including an upper plasma generation volume,
a showerhead electrode defined above the upper plasma generation volume to supply a first plasma process gas and radiofrequency (RF) power to the upper plasma generation volume,
a lower plasma chamber including a lower plasma generation volume,
a gas distribution unit disposed between the upper and lower plasma generation volumes, the gas distribution unit defined to supply a second plasma process gas to the lower plasma generation volume, the gas distribution unit including an arrangement of through-holes formed to extend from an upper surface of the gas distribution unit facing the upper plasma generation volume to a lower surface of the gas distribution unit facing the lower plasma generation volume to provide controlled fluid communication between the upper and lower plasma generation volumes, wherein the gas distribution unit includes interior gas supply channels fluidly connected to an arrangement of gas supply ports defined on the lower surface of the gas distribution unit to distribute a plasma process gas to the lower plasma generation volume, wherein the gas distribution unit includes embedded electrodes defined around the through-holes and around portions of the gas supply ports and below horizontal portions of the interior gas supply channels, each of the embedded electrodes defined to connect with any one of one or more direct current bias sources external to the gas distribution unit, and an exhaust channel configured to circumscribe the upper plasma generation volume outside of a radial periphery of the showerhead electrode and outside of a radial periphery of the gas distribution unit; and a chuck disposed within the interior cavity of the chamber below the lower plasma generation volume, the chuck defined to hold a substrate in exposure to the lower plasma generation volume, the chuck further defined to supply RF power to the lower plasma generation volume.

17. The system of claim 16, wherein the gas distribution unit is formed from an electrically conductive material and is electrically connected to a reference ground potential such that the gas distribution unit serves as a ground electrode for both the upper and lower plasma chambers.

18. The system of claim 16, wherein the chuck is movable in a direction toward and away from the gas distribution unit to provide for control of a distance extending perpendicularly across the lower plasma generation volume between the chuck and gas distribution unit.

19. The system of claim 16, further comprising:
a pressure throttle ring configured to move in a controlled manner within the exhaust channel to throttle a flow of gas from the upper plasma generation volume through the exhaust channel.

20. The system of claim 16, wherein the lower plasma chamber is defined to exhaust the lower plasma generation volume through a set of slotted channels defined to circumscribe the lower plasma generation volume outside of a radial periphery of the chuck and outside of a radial periphery of the gas distribution unit, the system further comprising a pressure control ring defined to cover the set of slotted channels when placed against the set of slotted channels, the pressure control ring defined to move toward and away from the set of slotted channels to throttle a flow of gas from the lower plasma generation volume through the set of slotted channels.

21. The system of claim 16, further comprising:
a first RF power source electrically connected to supply RF power to the upper plasma generation volume through the showerhead electrode;
a second RF power source electrically connected to supply RF power to the lower plasma generation volume through the chuck, wherein the second RF power source is independent from the first RF power source;
a first plasma process gas supply fluidly connected to the showerhead electrode; and
a second plasma process gas supply fluidly connected to the gas distribution unit, wherein each of the first and second plasma process gas supplies is independently controllable, such that flow rates of plasma process gases to the upper and lower plasma generation volumes are independently controllable.

22. The system of claim 16, wherein the exhaust channel is configured to extend in a radial direction away from the upper plasma generation volume so as to extend over a total radial distance as measured in a direction parallel to both a bottom surface of the showerhead electrode and a top surface of the gas distribution unit, the exhaust channel having a top surface and a bottom surface, each of the top and bottom surfaces of the exhaust channel oriented parallel to both the bottom surface of the showerhead electrode and the top surface of the gas distribution unit along the total radial distance over which the exhaust channel extends, the top surface of the exhaust channel positioned below the bottom surface of the showerhead electrode, the bottom surface of the exhaust channel positioned at or above the top surface of the gas distribution unit, the exhaust channel having a vertical size measured perpendicularly between the top and bottom surfaces of the exhaust channel, the vertical size of the exhaust channel less than a vertical size of the upper plasma generation volume as measured perpendicularly between the bottom surface of the showerhead electrode and the top surface of the gas distribution unit.

23. A gas distribution unit, comprising:
a plate formed to separate an upper plasma generation volume from a lower plasma generation volume, the plate having an upper surface and a lower surface, wherein the plate includes an arrangement of through-holes that each extend through the plate from the upper surface of the plate to the lower surface of the plate so as to fluidly connect the upper plasma generation volume to the lower plasma generation volume, and wherein the plate includes interior gas supply channels fluidly connected to an arrangement of gas supply ports defined on the lower surface of the plate to distribute a plasma process gas to the lower plasma generation volume; and
electrodes embedded within the plate, the electrodes defined around the through-holes and around portions of the gas supply ports and below horizontal portions of the interior gas supply channels, each of the electrodes defined to connect with any one of one or more direct current bias sources external to the plate.

24. The gas distribution unit of claim 23, wherein the plate is formed of an electrically conductive material, and wherein the plate is electrically connected to a reference ground potential so as to provide a ground electrode for each of the upper and lower plasma generation volumes.

25. The gas distribution unit of claim 23, wherein the interior gas supply channels and gas supply ports are defined between the arrangement of through-holes such that the plasma process gas is distributed to the lower plasma generation volume and is not distributed to the upper plasma generation volume.

26. The gas distribution unit of claim 23, wherein the interior gas supply channels are defined to fluidly separate the arrangement of gas supply ports into multiple concentric regions across the lower surface of the plate, such that flow rates of the plasma process gas to the gas supply ports within each of the multiple concentric regions is independently controlled.

27. The gas distribution unit of claim 23, wherein each through-hole is defined to extend from the upper surface of the plate to the lower surface of the plate at an angle offset from a reference direction that extends perpendicularly between the upper and lower surfaces of the plate, wherein the angle is sufficiently large to prevent an uninterrupted line-of-sight through the plate in the reference direction at each through-hole location.

28. The gas distribution unit of claim 23, further comprising:
a disc formed to be disposed on the upper surface of the plate, the disc including multiple patterns of holes extending through the disc, wherein each of the multiple patterns of holes aligns with a different set of through-holes within the plate, such that disposal of the disc on the upper surface of the plate at a particular rotational position of the disc relative to the upper surface of the plate corresponds to alignment of a particular one of the multiple patterns of holes with its corresponding set of through-holes within the plate, wherein the disc is secured to the plate such that thermal and electrical conduction exists between the disc and the plate.

29. The gas distribution unit of claim 28, wherein each of the multiple patterns of holes extending through the disc is defined to expose a different number or a different spatial pattern of through-holes within the plate.

30. The gas distribution unit of claim 23, further comprising:
a central disc and a number of concentric rings formed to be disposed in a concentric manner on the upper surface of the plate, each of the central disc and the number of concentric rings respectively including multiple patterns of holes extending there through, wherein each of the multiple patterns of holes aligns with a different set of through-holes within the plate, such that disposal of each of the central disc and the number of concentric rings on the upper surface of the plate at a particular rotational position relative to the upper surface of the plate corresponds to alignment of a particular one of the multiple patterns of holes with its corresponding set of through-holes within the plate, wherein the central disc and each of the number of concentric rings is secured to the plate such that thermal and electrical conduction exists between the plate and each of the central disc and the number of concentric rings.

31. The gas distribution unit of claim 30, wherein each of the multiple patterns of holes extending through the central disc and the number of concentric rings is defined to expose a different number or a different spatial pattern of through-holes within the plate.

32. The gas distribution unit of claim 30, wherein the central disc and the number of concentric rings are independently movable to respective rotational positions relative to the upper surface of the plate.

* * * * *